United States Patent [19]
Schwiebert et al.

[11] Patent Number: 5,880,017
[45] Date of Patent: *Mar. 9, 1999

[54] METHOD OF BUMPING SUBSTRATES BY CONTAINED PASTE DEPOSITION

[75] Inventors: Matthew K. Schwiebert, Palo Alto; Donald T. Campbell, Campbell; Matthew Heydinger, Sunnyvale; Robert E. Kraft, Santa Clara; Hubert A. Vander Plas, Palo Alto, all of Calif.

[73] Assignee: Hewlett-Packard Co., Palo Alto, Calif.

[ * ] Notice: The term of this patent shall not extend beyond the expiration date of Pat. No. 5,539,153.

[21] Appl. No.: 920,221

[22] Filed: Aug. 25, 1997

Related U.S. Application Data

[63] Continuation of Ser. No. 618,225, Mar. 19, 1996, abandoned, which is a continuation of Ser. No. 287,453, Aug. 8, 1994, Pat. No. 5,539,153.

[51] Int. Cl.$^6$ .................................................. H01L 21/44
[52] U.S. Cl. .......................... 438/613; 438/614; 438/615; 29/180.1; 29/180.2; 257/737; 257/738
[58] Field of Search ............................... 29/180.1, 180.2; 438/612–617, 343; 257/737, 738

*Primary Examiner*—John F. Niebling
*Assistant Examiner*—David A. Zarneke

[57] ABSTRACT

A solder bump is stenciled onto a substrate, providing bumped substrate at pitches below 400 microns. The solder is applied through stencil/mask and paste method; the mask, however, remains attached to the substrate during reflow. Pitches of greater than 400 microns may also be obtained through the invention. The invention further provides for generation of uniform, controllable volume metal balls.

18 Claims, 9 Drawing Sheets

METHOD OF BUMPING SUBSTRATES BY CONTAINED PASTE DEPOSITION

CROSS REFERENCE TO RELATED APPLICATION(S)

This is a continuation of application Ser. No. 08/618,225 filed on Mar. 19, 1996, now abandoned, which is a continuation of Ser. No. 08/287,453 filed on Aug. 8, 1994, now U.S. Pat. No. 5,539,153.

BACKGROUND OF THE INVENTION

1. Field of the Invention

This invention relates to a method and process for attaching an electrically conductive substance onto substrates and, in particular, a process that provides attachment of solder bumps onto substrates with particular advantages in applications in which a pitch of less than 400 microns is required.

2. Background

Enormous research and development resources are spent the world over in the perennial search for low cost, high volume methods of producing and assembling integrated circuits or "chips". An integral piece of chip assembly is making electrical interconnections. Solder bumped flip chip technology has become extremely popular because it provides a tiny semiconductor die with terminations all on one side (in the form of solder pads or bumps); after the chip surface has been treated, it can be flipped over and attached to a matching substrate. To make the connection, flip chip technology includes techniques for affixing bumps of electrically conductive material onto substrates, including boards, packages and chips. Flip chip bumping techniques have also proven useful in tape automated bonding (TAB). Other applications for solder bumps have included optoelectronics and silicon-on-silicon interconnects.

Flip chip technology presents a number of advantages that make it a preferred form of electronic interconnect. Flip chip provides improved electrical performance. Flip chip interconnections are the most efficient electrical interconnections for high frequency applications such as main frames and computer workstations. In addition to efficiency in function, the flip chip is efficient in form because of its small size. As devices of ever greater power are reduced in size, flip chip provides the smallest interconnect option. Other advantages include easier thermal management and reduced EMI emmissions and reduced RFI susceptibility.

Solder bump flip chip assembly can be made compatible with well-established Surface Mount Technology (SMT). (For a thorough introduction to SMT, please refer to the *Handbook of Surface Mount Technology*, Stephen W. Hinch, Longman Scientific & Technical, UK, 1988.) With the appropriate choice of solder bump metallurgy, an SMT assembly line can simultaneously assemble both flip chip and surface mount packages on a product passing through the line. This compatibility provides the utilization of an installed base of SMT assembly lines as well as the flexibility of designing packages incorporating flip chip into larger SMT packages. Perhaps the most telling advantage of flip chip over other packaging technologies is its lower cost. Flip chip eliminates an entire level of interconnect—the package level (see Steps B through E in FIG. 2). By eliminating the package level, system cost is significantly reduced. In the IC business generally, the potential cost savings justify investments in multi-million dollar flip chip technology research.

The primary way of making flip chip interconnects is with solder bumps. Solder bumps have been applied by evaporation, electroplating, stencil printing and serial methods. However, each of these methods has particular limitations and much research has been and is being performed to overcome the limitations of each of these methods.

For the past three decades, companies such as IBM have used evaporation to form high lead (Pb) bumps for flip chip applications. One major disadvantage of evaporation is the high cost: at least ten million dollars worth of capital equipment is required. Processing costs are also high due to tooling and mask costs, process delays, low throughput low yields, and necessarily frequent manual removal of hazardous lead waste. Finally, alloy compositions are limited because many metals are not suitable for evaporation. Especially limiting is the fact that the deposition rate of tin (Sn) is such that it cannot readily be evaporated. A high tin alloy (63Sn-37Pb, that is "eutectic") is highly desirable as a bumping material, because the melting point of eutectic tin ($T_m$=183 degrees C.) is compatible with existing SMT materials and processes (usually performed at 200–210 degrees C.). By contrast, the melting point of lead is 327 degrees C., a temperature that would melt many of the organic materials used in SMT (e.g. epoxy circuit boards, whose maximum temperature is 230 degrees C., and other components).

There is no shortage of patents that have issued covering improvements in the evaporation process. Because the evaporation process involves vaporizing lead and allowing the lead to deposit on all surfaces, both masked and unmasked, the cleaning of the metal shadow mask is messy and hazardous. The metal mask can only be reused three or four times before it is no longer cleanable and must be discarded. The waste lead, including the lead-encrusted metal mask, poses environmental and worker safety problems as well as escalates manufacturing expense. A recent patent, U.S. Pat. No. 5,152,878, addressed the problem of mask cleaning and presented some labor saving cleaning techniques. However, although improvements may speed bumping and reduce labor costs to a certain degree, the equipment required for evaporation remains costly, and the hazards of the waste lead are ever-present.

Whereas the evaporation technique is fraught with the hazards of vaporizing lead, electroplating is a wet technique using chemical baths as the medium in which to deposit bumps. The chemical baths contain lead and other hazardous materials that pose a handling and disposal problem. Moreover, electroplating is limited in efficiency because it is a batch process. Thus, volume production faces the attendant challenges of an equipment intense serial process and, as IC manufacturers are all too keenly aware, cost is governed by the production volume or capacity limits. Other disadvantages of electroplating include difficulty in alloy composition control, problems in consistently achieving acceptable bump height at small bump pitches, and difficulty in the elimination of surface impurities.

Stencil printing (also known as screen printing), depicted in FIG. 2A, is by far the simplest approach, at least conceptually, but has posed seemingly insurmountable limitations on bump size and pitch. (See, generally, *Handbook of Surface Mount Technology*, ibid, pp 245–260).

As depicted in FIG. 2A, stencil printing involves placing a mask 10 or screen on a substrate 12, slathering on a solder paste on top of the mask, using a squeegee 16 to squeegee the paste, which serves to force paste into all the apertures in the mask and to scrape off the excess paste, and removing the mask prior to re-flowing the solder paste. Re-flow is essentially controlled melting in order that the small spheres of metal that compose the solder paste coalesce to form the electronic interconnect.

Packing more interconnects on smaller chip has created a need for smaller bumps with smaller pitch (pitch being the distance between the centers of two adjacent bumps). Conventional stencil printing methods have had a lower pitch limit of 400 microns, primarily due to the limitations on well-established stencil aspect ratio (about 2.5:1) of aperture width relative to mask thickness. This limit is the result of the interplay of the spacing of holes in and thickness of the stencil and the physical and chemical characteristics of the solder paste. The well-known pitch limitation convinced IC manufacturers that stencil printing had no future in the majority of flip chip bumping applications since a pitch of less than 400 microns is required.

AT&T has used stencil printing to produce silicon-on-silicon assemblies. The process involves mounting the mask, joining the silicon to silicon with stenciled paste between the silicon components, and reflowing, thereby producing a silicon-on-silicon attach. The mask apertures are limited by the aspect ratio.

Serial methods have been proposed, and while attractive in theory, none has been commercialized. Proposed methods have included "stud-bumping" with wirebonding equipment (also known as "wirebond bumps"), decal processing, and solder jet processes. Methods proposed to simplify serial processes still require multiple steps. U.S. Pat. No. 5,156,997 issued to Kumar et al. describes a simplified process consisting of depositing a barrier and diffusion layer, forming a bump from a metal using a focused liquid metal ion source, and removing the exposed barrier/adhesion layer by etching. The process takes over 13 hours to bump a 200 die wafer. Thus, even simplified serial processing has associated processing disadvantages such as slow throughput.

A dramatic and significant improvement would be a simple, low cost, high volume, environmentally friendly (or environmentally neutral), non-hazardous process for applying bumps of various alloys to substrate where the bumps are uniform in height and the pitch small, and, ideally, such a method would provide bump alloys that are compatible with existing surface mount technology assembly lines.

SUMMARY OF THE INVENTION

The invention provides a non-hazardous, environmentally neutral process for bumping substrates (including silicon wafers) for electronic interconnects. The inventive process provides for Contained Paste Deposition (CPD) on masked substrate with mask attached during reflow. The process provides for bumps that are suitable for flip chip application with pitches of less than 400 microns. Process cost is further lowered by inventive aspects including a reusable metal mask in one embodiment, and a photoimageable polymer coating, removable or not, in other embodiments.

Further, this method uses manufacturing technology that is well-characterized and suitable for volume production.

CPD separates the composition control of the bump from the volume control of the bump. For example, in evaporation and plating, the volume and composition are determined simultaneously in a single process step. With CPD, the composition of the metal is determined during the paste manufacture; while the process of forming the bumps determines the volume of the metal bump.

Virtually any alloy composition can be used to bump wafers according to the present invention. The limitations of evaporation methods are completely overcome because CPD allows the selection of any alloy, whereas many alloys cannot be effectively evaporated. When compatibility with SMT is desirable, melting point characteristics are essentially the only limitation in alloy selection. The inventive method provides more precise control of the alloy composition than currently achievable in alloy and elemental plating methods. The present method provides solutions to environmental and worker safety issues associated with current methods of applying lead (Pb) via evaporation or the chemical waste produced by plating baths. Consistent bump height, volume, and spacing can be accomplished.

BRIEF DESCRIPTION OF THE DRAWINGS

FIG. 1, 1A and 1B inclusive, depicts cross-sections of the mask/paste/substrate and mask/bump/substrate assembly according to the invention.

FIG. 2, 2A through 2I inclusive, represents conventional stencil method, conventional SMT packaging, and conventional stencil method as used in the SMT assembly process.

FIG. 3, 3A through 3H, represents flip chip bump formation and flip chip assembly according to the invention.

FIG. 6, 6A through 6C inclusive, represents the invention providing attached stand-off bumps.

DETAILED DESCRIPTION OF THE INVENTION

Figure 4:
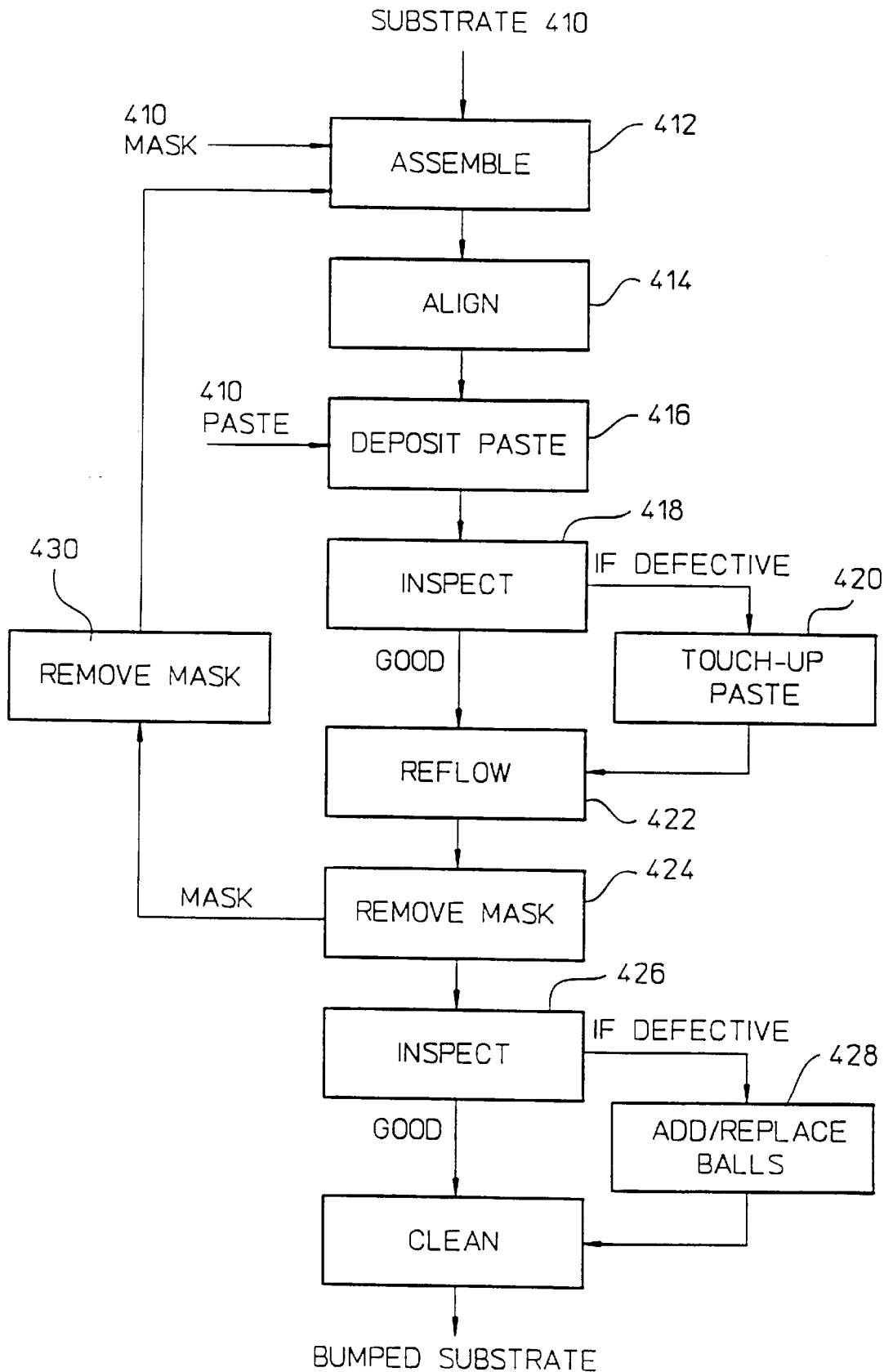
FIG. 4 is a flow chart of the bump formation method according to the present invention.

As outlined in FIG. 4, the inventive method generally includes the steps of selecting 410 a substrate, mask and paste; assembling 412 the substrate and mask; aligning 414 the substrate-mask, depositing 416 the paste; reflowing 422 the substrate-mask-paste, removing 424 the mask; cleaning 430 the mask; reusing the mask in another repetition of the process. Other embodiments eliminate the step of mask removal 424; still others include intermediate inspection 418, 426 and touch-up 420, 428 steps to ensure the uniform thickness of solder paste deposition and ball placement. If a nonwettable substrate is used, then rather than a bumped substrate, the method generates solder ball of controlled volume.

FIG. 3, A through H inclusive, illustrates the inventive process. FIG. 3A through 3E illustrates flip chip bump formation and FIG. 3F through 3H illustrates flip chip assembly. The selected substrate 320 having a surface 321 or active side selected for the formation of electrical interconnections to which wettable or solderable regions 322 or solderable bump limiting metal (BLM) regions have been attached. In the preferred embodiment, the substrate chosen is a silicon wafer with a BLM that is wettable by the alloy to be deposited. Silicon wafer with zincated pads (Al pads treated with electro-less Zn, Ni, then Au plated), and passivated with SiN (silicon nitride) is the substrate/BLM combination of the preferred embodiment. It is simple and effective to prepare a wafer with solderable (or wettable) BLMs on a pitch of 400 microns or less. The center-to-center distance between each wettable BLM corresponds to the pitch of the bumps; the preferred embodiment provides for pitches in the range of 150 to 350 microns. This minimum pitch limitation is currently a function of mask technology, and even smaller pitches are achievable with the present invention with improvements in mask fabrication technology.

The remaining regions of the substrate surface 321 must be non-wettable regions 324 (for example, regions of the substrate covered by non-wettable materials, such as polyimide, silicon nitride, or, silicon dioxide). In the preferred embodiment for 63Sn-37Pb bumps, the silicon wafer has wettable regions of Ni-Au and non-wettable regions of silicon nitride.

Figure 1A:
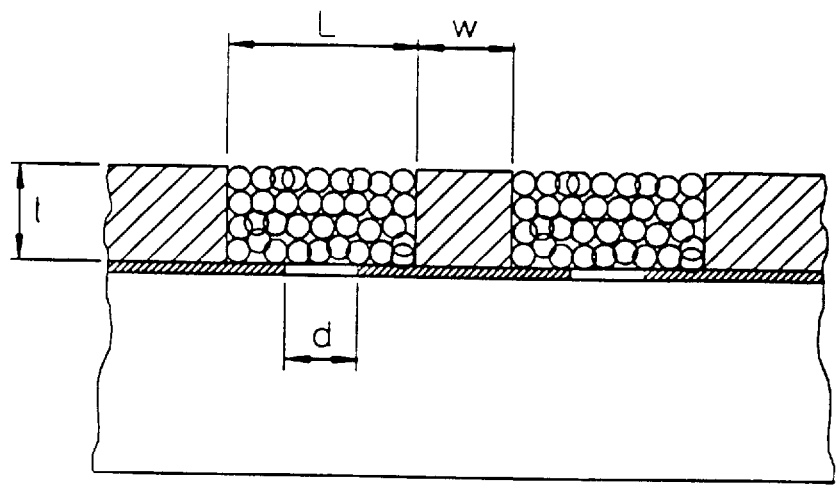
Figure 1B:
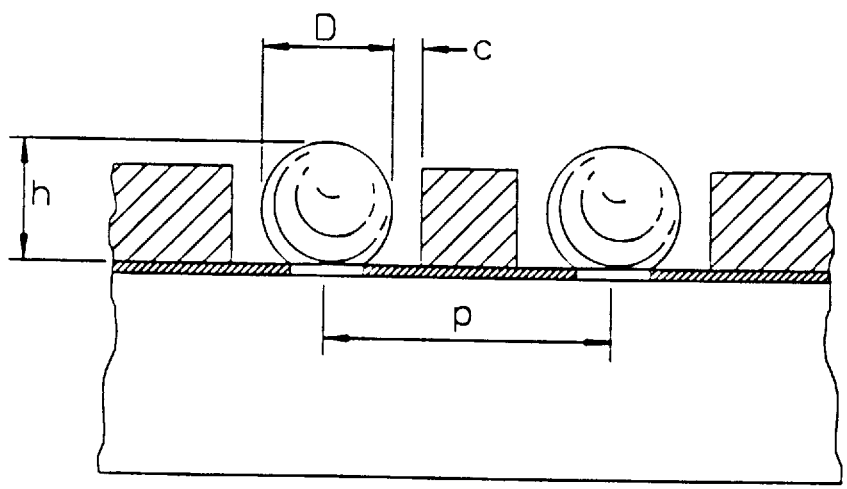
Figure 2A:
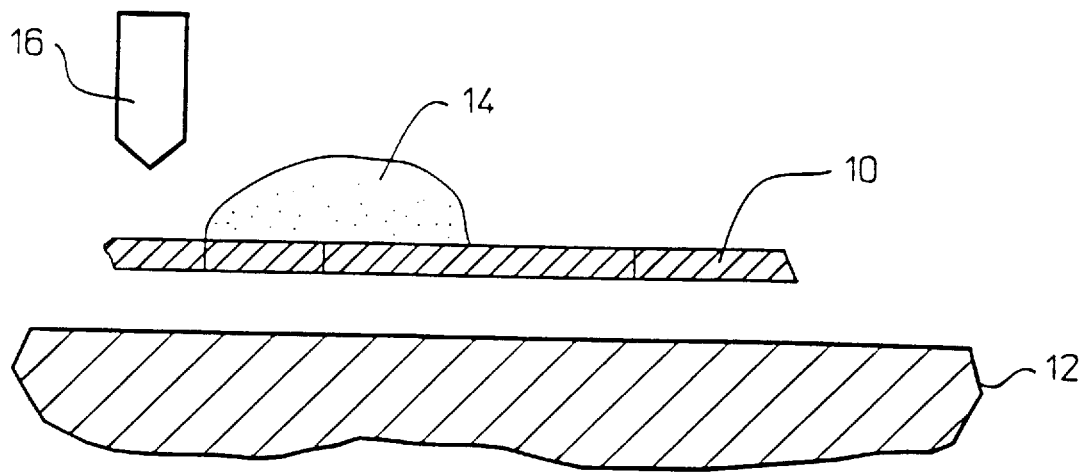
Figure 2A:
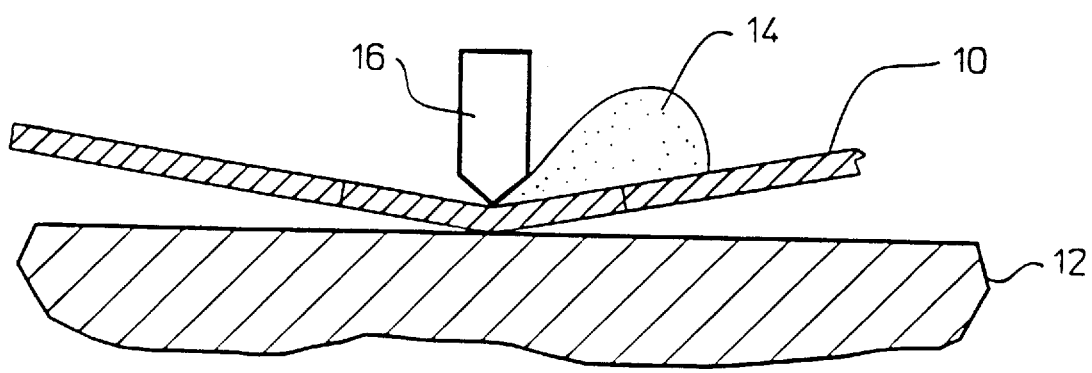
Figure 2A:
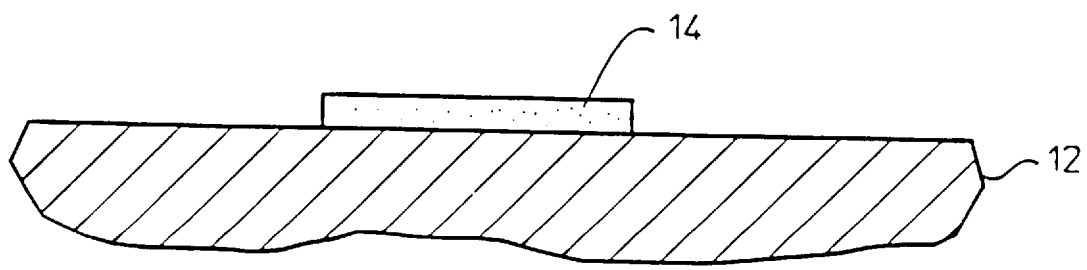
Figure 2B:
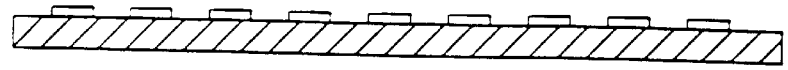
Figure 2C:
Figure 2D:
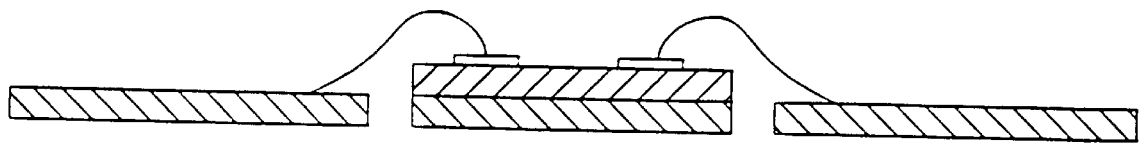
Figure 2E:
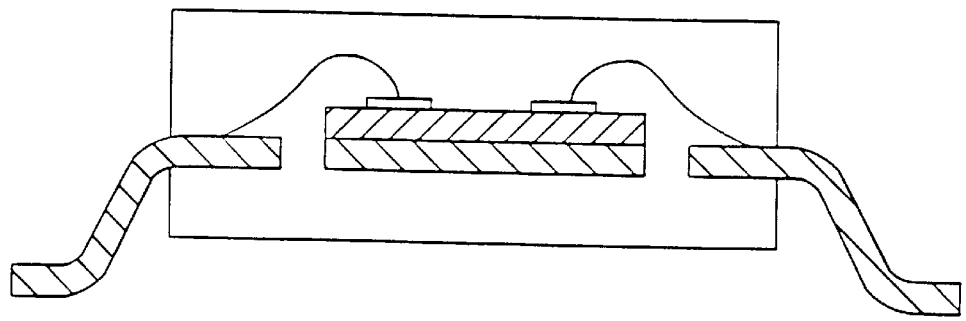
Figure 2F:
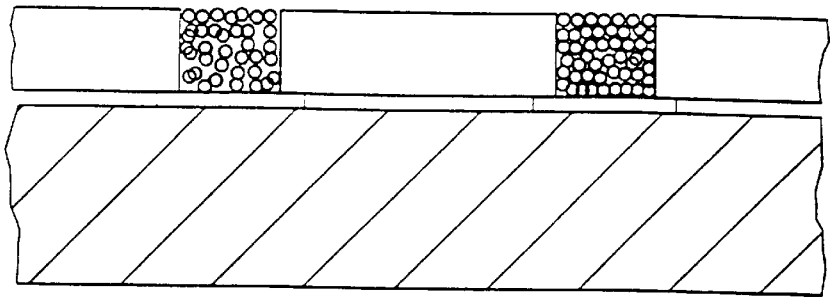
Figure 2G:
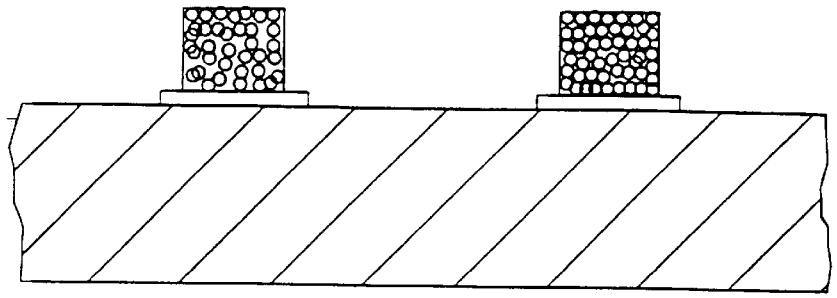
Figure 2H:
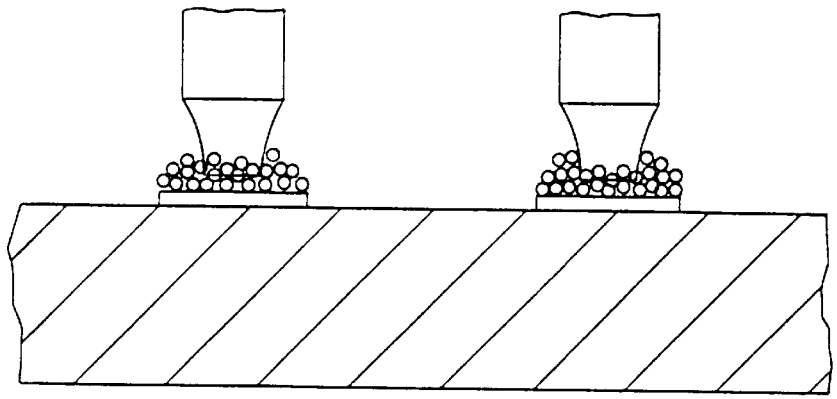
Figure 2I:
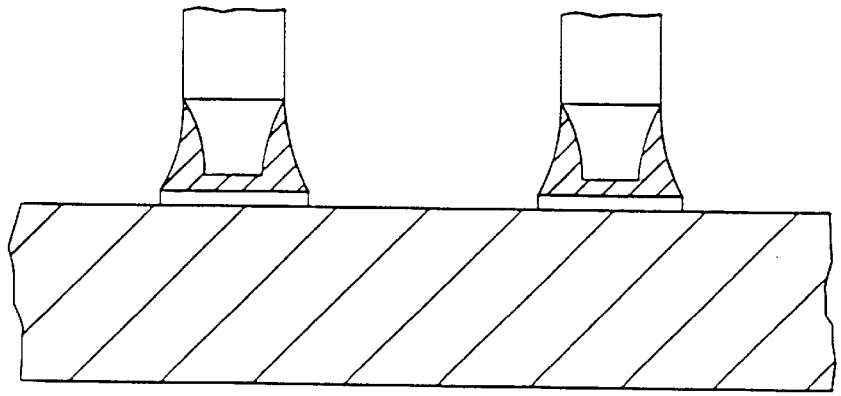

A pair of cross-sections of the mask/substrate/paste and mask/substrate bump assembly is shown in FIG. 1A and B, respectively. The design of the apertures (the holes or reservoirs which are cut into the mask to contain the paste) determines the final solder bump height (h) and bump-to-mask clearance (c) as a function of following the diameter of the wettable bump limiting metal (d), the aperture size (L), the paste packing factor (PF), and the mask thickness (t).

The desired volume of the reflowed bump ($V_{bump}$) can be expressed as the volume of a truncated sphere, as a function of h and d:

$$V_{bump} = \pi \left( \frac{h^3}{6} + d^2 \frac{h}{8} \right).$$

The volume of the paste aperture (volume of the paste that is deposited, $V_{paste}$) is related to the final bump volume of the sphere by the paste packing factor (PF) which is defined as the ratio of the bump volume to the paste volume:

$$V_{pane} = \frac{V_{bump}}{PF}.$$

The most efficient packing of equal diameter spheres is hexagonal-close-packed (HCP) or face-center-cubic packing, resulting in PF=0.74. In practice, however the packing factor is somewhat lower than this.

The aperture (L) and mask thickness (t) are determined as a function of the required aperture volume ($V_{paste}$), the bump pitch (p), the minimum allowable web width (w), and the minimum allowable bump-to-mask clearance (c). The bump-to-mask clearance (c) is:

$$c = \frac{(L - D)}{2},$$

where the reflowed ball diameter (D) is $$D = h + \frac{d^2}{4h},$$

and the web width (w) between the apertures is w=p–L

In practice there are limitations on the minimum allowable web width (w), as well as the minimum allowable bump-to-mask clearance (c) for adequate stencil release.

In the preferred embodiment, the apertures are cyllindrical, such that $$V_{pane} = \frac{\pi L^2 t}{4}.$$

In the preferred embodiment, the mask/substrate/bump parameters are:

| p [μm] | d [μm] | h [μm] | L [μm] | t [μm] | Vpaste [× $10^6$ μm$^3$] | Vbump [× $10^6$ μm$^3$] | PF | D [μm] | w [μm] | c [μm] |
|---|---|---|---|---|---|---|---|---|---|---|
| 356 | 200 | 118 | 225 | 100 | 4.0 | 2.7 | .65 | 203 | 131 | 11 |
| 250 | 150 | 118 | 190 | 100 | 2.8 | 1.9 | .65 | 166 | 60 | 13 |
| 175 | 100 | 90 | 125 | 85 | 1.0 | .74 | .70 | 117 | 50 | 4 |

Other mask variations include non-cylindrical apertures for greater volume and larger webs, as well as non-vertical side walls such as tapered apertures for improved release.

Multi-pass print/retflow cycles may be included to provide increased bump volume and, if desired, non-homogeneous bumps.

Mask

Figure 3A:
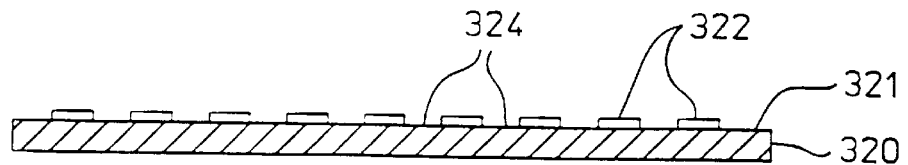
Figure 3B:
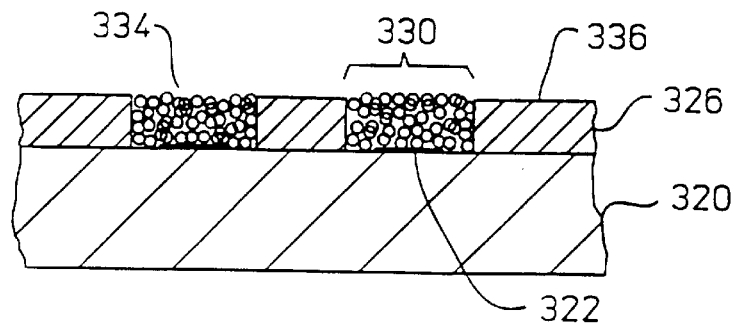
Figure 5:
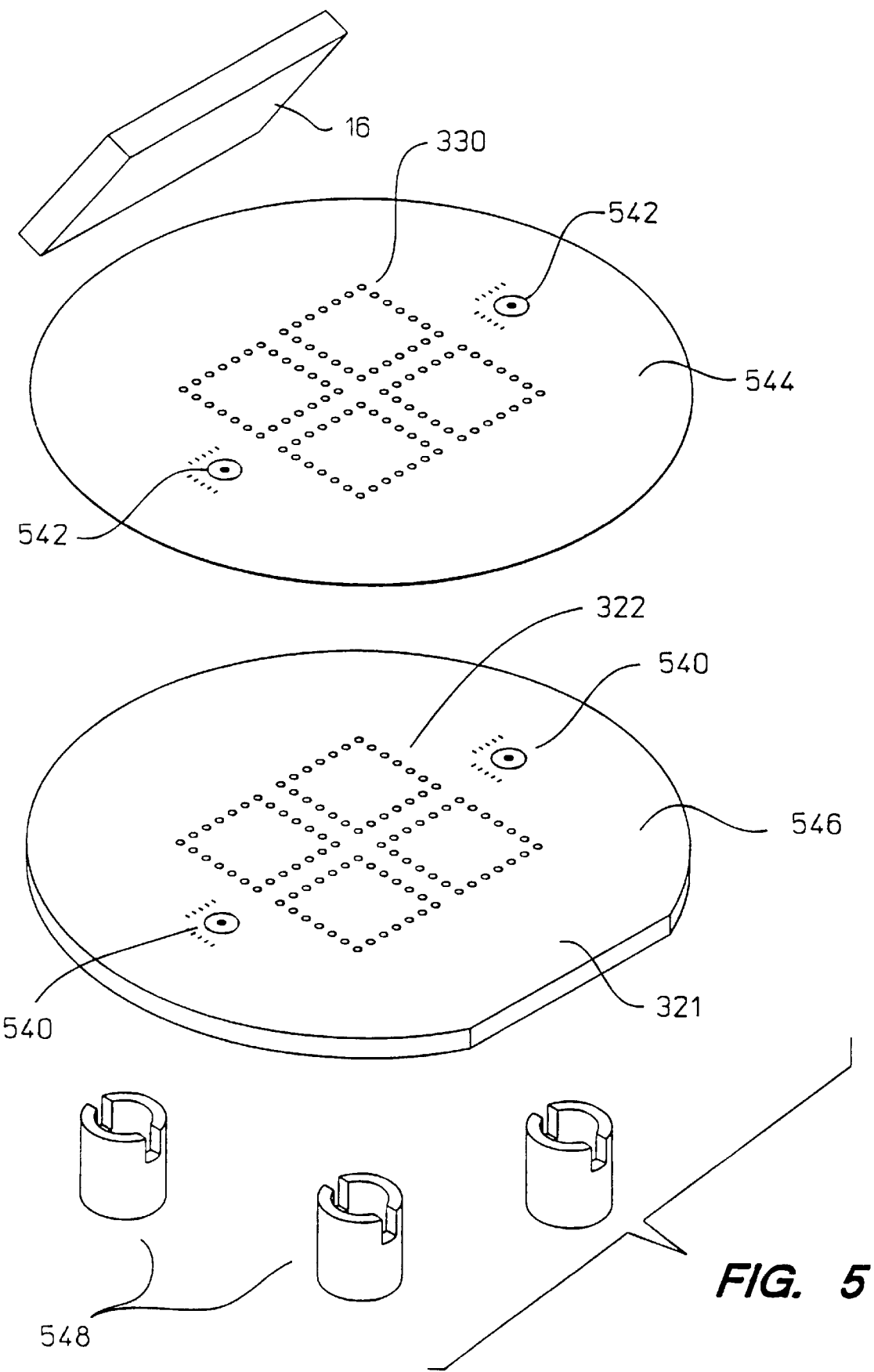
FIG. 5 illustrates the assembling of mask upon the substrate in the preferred embodiment.

As shown in FIG. 3B, a mask 326 is placed on the surface 321 of a substrate 320. In the preferred embodiment, the mask 326 is made from metal, specifically 75–100 micron thick tension-leveled and sheeted alloy 42. Mask materials may include photoimageable polyimide, dry film photomask, liquid photoimageable photomask, silicon, and ceramic. The arrangement and location of the mask apertures 330 correspond to the arrangement and location of the wettable 322 regions of the substrate 320. As depicted in FIG. 5, the substrate surface 546 and the mask 544 each have a pair of holes or Vernier patterns 540, 542. These may serve as alignment guides to allow the mask apertures 330 to be positioned correspondingly to the wettable regions of the substrate surface when the mask is placed upon the substrate.

The mask has two purposes. The first is to provide a reservoir to control the volume of paste to be deposited. The second is to act as a dam or otherwise to contain the paste until, and during, the reflow process. The second application is what differentiates this process from standard SMT processing.

Because the aspect ratio of apertures for pitches less than 400 microns does not allow for removal of the mask from the substrate (without removing the paste with the mask) the mask must remain in position during the reflow process. In order to act as the paste reservoir and dam three issues not experienced during SMT processing must be resolved.

(1) The coefficient of thermal expansion (CTE) of the mask must closely match that of the substrate so that misalignment does not occur because of mismatched thermal strains during the reflow process. In the preferred embodiment, this entails the use of Alloy 42 for the mask material in order to closely match the CTE of the silicon substrate. (Silicon CTE=2.5E-6 in/in/degree C., Alloy 42 CTE=4.4E-6 in/in/degree C.).

(2) The support structure which holds the mask in position on the substrate must not impose a strain on the mask or the substrate. In SMT stencil printing the mask is tensioned in a frame. To allow for use of standard frame mounting techniques the frame material must be identical to the CTE of the mask and the thermal mass of the frame must he minimized to eliminate distortion or tearing of the mask during reflow (due to excursion and the resulting strain during the heating and cooling steps). In the preferred embodiment, high temperature magnets (AlNiCo) are used to attach the mask to the substrate, thus eliminating the need for a frame. Since the mask material is ferrous, the magnets can be placed on the side of the substrate opposite the mask. If more attachment force is necessary, magnets can be placed on both sides of the mask/substrate sandwich. Alternate embodiments include mechanical clamping of the substrate to the mask and use of a frame to tension the mask that matches the CTE of the mask.

(3) The stencil surface must not be wettable by the chosen metal paste. If the mask surface is wettable, the metal paste, instead of separating from the mask and sticking only to the pads on the substrate, will stick (or wet) to the mask during reflow. In order to eliminate this problem the mask is chrome plated, since chrome (and chrome oxides) are non-wettable by the eutectic Sn-Pb solder that is used.

Mask—Alternate Embodiments

Other alternate embodiments include different metal or non-metal separable masks designed to match the substrate CTE and non-wettable to the metal paste selected.

An alternate method for performing the two noted mask functions is the application of a removable mask to the substrate surface with appropriate aperture sizes to obtain the desired bump size. In this embodiment, a polymer mask would be applied to the surface of the substrate, with apertures formed by chemical, mechanical or plasma etching or laser ablating the desired size holes in the mask located above the wettable pads. The remainder of the process would be identical, with the exception of the cleaning process, which would require the use of a solvent that would remove both the temporary mask and residue from the flux (or two cleaning steps).

Further, alternate embodiments include other mask materials which are removable by chemical etching or cleaning or lift-off (liquid photoimageable photomask, dry film photomask, peeling/lift-off polyamide, ceramic, or silicon).

Alignment

FIG. 5 illustrates the assembly of the mask 544 and substrate 546, the application of magnets 548 to hold the mask upon the substrate from below through magnetic attraction, and the alignment of mask opening and substrate BLM pad. Corresponding mask apertures 330 are aligned with the wettable regions 322 of the surface 321 to receive bumps. This alignment may be accomplished manually using a microscope and tapping the wafer with respect to the mask while aligning the apertures and pads. Alternatively, alignment may be accomplished by using tooling pins and corresponding holes. Automated alignment may be accomplished using tooling pins or fiducials and a vision system.

The mask aperture 330 dimensions are generally (but are not required to be) somewhat larger than the dimensions of the wettable region. Aperture size is determined by the bump size required. The apertures are not required to have the same shape as the solderable pad. To increase the size of bumps and yet retain small pitch, the mask aperture may be oblong and the BLM circular or octagonal. Upon reflow, the solder becomes spherical on the BLM circular pad.

A mask aperture may also be designed to cover more than one pad for very fine pitches (less than 175 $\mu$m).

Paste Deposition

As shown in FIG. 3B, after alignment a paste-like formulation 334 containing spherical metal powder and flux is deposited onto the mask surface 336 and spread so that it fills each mask aperture 330. This process is generally and commonly referred to as "squeegeeing".

A large dollop of metal paste is placed on the mask surface. The paste is then squeegeed across all apertures and then squeegeed to clean the surface of the mask. This leaves paste only in the apertures. The paste deposits are then inspected to insure that all apertures are filled. If any un-filled or partially-filled apertures are seen, a paste dollop is again squeegeed across the apertures and then further squeegeed to clean the surface of the mask. If inspection shows all apertures are filled, the remaining dollop of paste is removed from the mask; if not, the squeegee/inspection process is repeated.

Paste deposition may be completely automated.

Solder paste: The initial embodiment uses a standard solder paste formulated for use with eutectic Pb-Sn solder in a standard SMT stencil printing process. The flux vehicle, SMQ 51AC, is provided by Indium Corporation of America, 36 Robinson Road, Clinton. N.Y. 13323. Only the particle size distribution has been modified to a "–400+500" mesh distribution to meet the requirements of CPD.

Solder paste is a homogeneous, stable suspension of metal powder in a flux vehicle. The flux vehicle not only contains the flux but also other constituents that determine the solder paste performance during the stencil printing, placement, and reflow processes. The initial embodiment uses a solder paste designed for standard surface mount stenciled printing with eutectic Pb-Sn solder. The ability to obtain consistent metal bump formation can be optimized in the following ways:

1. Metal powder size deposition

The range of the particle size in the metal powder is a compromise between maximizing the metal content while minimizing the metal oxide content of the deposited solder paste. The upper limit of the size distribution is set by the mask thickness. The largest allowed particle diameter should be below 40% of the mask thickness. For a mask thickness of 100 microns, this gives a maximum particle diameter of about 40 microns. The lower limit of the size distribution is dictated by the need to minimize the metal oxide content. For Pb-Sn based solder, the oxide content of the solder increases dramatically for particle diameters less than 25 microns. Thus, for initial demonstrations of this concept, the minimum particle size diameter is set to 25 microns. This size distribution is commonly referred to as "–400, +500". Optimization of the particle size distribution is part of the manufacturing development of this concept. In other embodiments of this invention using other metallurgies, a different particle size distribution may be necessary.

2. Solder Paste Flux Vehicle

"Solder paste flux vehicle" is a term used to describe all the non-metal constituents in the solder paste. Solder paste designed to be used in a standard SMT stenciling process contains a number of constituents that may not be needed for CPD.

a. Rheological agents

These constituents are added to the solder paste flux vehicle to control the properties of the solder paste during the squeegeeing and stencil release portions of the standard stenciling operation. (Various high boiling point solvents are often added as rheological agents). In addition, constituents are added to prevent the free-standing solder paste bricks from slumping and causing solder bridges during the reflow process. Some of these constituents are essential to the squeegeeing operation and must remain in the solder paste. However, those may not be needed for CPD.

b. Tackifier

This constituent is needed to hold a surface mount component onto the substrate or printed circuit board during the placement and reflow processes. Since no components are placed during contained pasted deposition, this constituent can possibly be eliminated from the solder paste. Elimination of this constituent should help in the release of the mask from the solder bumps after reflow.

c. Activators

These constituents are needed to chemically etch the oxide films that exist on the surfaces of the metal powder and the surface of the under-bump metallizations. The need for activators in the CPD process is the same as the need for activators in contained paste deposition and is a distinct advantage over other methods of forming metal bumps. These activators provide a means for removing oxides from the under bump metallization during bump formation. Each of the other techniques requires that the under bump metallization be free of oxides before the start of the bumping process.

The solder paste flux vehicle is formulated to meet the requirements of the specific metallurgy chosen for each application. For example, the flux in a Pb-Sn solder paste with a Pb weight percent greater than 90% must withstand higher temperatures than a eutectic Sn-Pb solder paste. A low temperature solder such as eutectic Sn-Bi solder requires a lower temperature activation system than the eutectic Pb-Sn solder. CPD provides flexibility in the selection of the constituents of the flux vehicle according to whatever modifications may be necessary to meet the specific metallurgical and temperature needs of each metal chosen.

3. Metal Powder composition

A major advantage of CPD is the ability to use any metal that can be fabricated into a metal powder and that can be melted to coalesce into a single, larger, metal bump.

The metal powder is mixed with a flux vehicle to form a "solder paste"; the metallurgical composition of the metal powder becomes the composition of the metal bump. Thus, in contained paste deposition, the metal bump metallurgy is determined by a process that is different, and better controlled, than existing metal bump formation processes. For example, in the evaporation process, two independent evaporation sources must be controlled during the bump formation process to yield both the compositional and volume control of the metal bump. Typical compositional control for evaporated or plated bumps is ±5%; eutectic Sn-Pb solder bumps are not generally available with the evaporation process due to the large difference in the evaporation rates of Pb and Sn. Typical composition control for metal powder is ±0.5%, a full order of magnitude better than alternate approaches. In addition, a eutectic Sn-Pb solder can be provided with the same composition control as a high Pb solder. Compositional control for other metals will depend on the processing technique. If atomization techniques are used, compositional control of ±0.5% will be typical.

Reflow

Figure 3C:
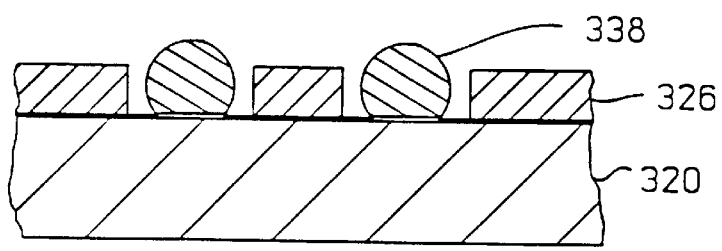
Figure 3D:
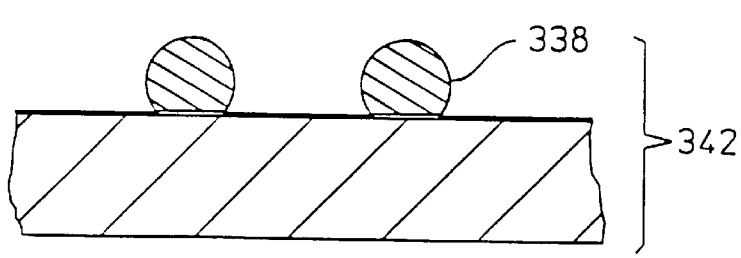

Next, the entire substrate 320, mask 326 and solder 334 assembly is heated in order that the solder 334 reflows (see FIG. 3C). That is to say, it is heated until the solder paste metal spheres 334 melt and coalesce into a single sphere or solder bump 338, one bump 338 per mask aperture 330.

The reflow process in contained paste deposition is almost identical to that used for standard surface mount processes (SMT). In order to promote the coalescence of the metal powder to form metal bumps, three well understood time-temperature regions must be maintained in a reflow profile:

1. Solvent evaporation

Solvents are added to the solder paste to control the squeegeeing portion of the process. These solvents must evaporate during the reflow operation (prior to the metal melting). In the initial embodiment of this concept with eutectic Sn-Pb solder and Indium Corporation SMQ51AC solder paste, the temperature of the substrate and solder paste is maintained between 90° and 110° C. for a minimum of 50 seconds. Other solder paste formulations will require different temperatures and times.

2. Flux activation

In order to coalesce the metal powder into a single metal bump as well as form a metallurgical bond to the under bump metallization, the temperature of the solder paste and substrate must be held for a specific length of time at a prescribed temperature to allow the activators in the solder paste to remove the metal oxides from both the under bump metallizations and the surface of each of the individual metal particles. In the initial embodiment with eutectic Sn-Pb solder and Indium Corporation SMQ51AC solder paste, the temperature of the substrate and solder paste is maintained between 150° and 170° C. for a minimum of 50 seconds. Other solder paste formulations require different temperatures and times.

3. Maximum temperature

General reflow soldering practices recommend that the maximum solder temperature should be between 30° and 50° C. above the melting point of the solder powder. For the eutectic Sn-Pb solder used in the initial embodiment, the maximum temperature of the reflow is between 210° and 230° C. Other metal alloys have different melting points which require the use of different maximum temperatures.

The maximum temperature change rate varies slightly from a normal surface mount assembly process. In a normal surface mount reflow process, the maximum temperature change rate is dictated by the ability of certain surface mount components to survive the rapid temperature changes. In contained paste deposition, the maximum temperature change rate is determined by the requirement that the mask and the substrate change temperature at the same rate.

Cleaning

After bumps are formed during the reflow process and the assembly is cooled, portions of the solder paste flux vehicle remain (residues) and may cause the mask 326 to adhere to the substrate 320. These residues are dissolved by soaking the mask and substrate in an appropriate solvent. In the initial embodiment, a mixture of 50% isopropyl alcohol and 50% water dissolves the residues and allows the mask to be removed from tile substrate. After separation, the substrate and the mask are more thoroughly cleaned. After cleaning, the mask is returned to the start of the process for re-use on another substrate.

The reusable metal mask is a novel and inventive feature of this process. The mask remains in place during both deposition and re-flow processes. This eliminates process restrictions inherent in conventional stencil printing. Moreover, the invention provides for the deposition of smaller bumps at finer pitches with repeatable volumes.

Cost is lowered because the process is simple when compared with current alternatives. Alloy composition is controllable because the technology for manufacturing the metal powder for soldering is well established. Alloy composition can be controlled to within ±0.5% and is independent of bump size, wafer size, and location of the bump on the wafer.

Because little specialized equipment is required for the practice of the invention, and because most equipment suitable for stencil printing, reflow and cleaning is commercially available and well-characterized, manufacturability of the invention is assured. Despite modest modification and development costs, high volume production is virtually assured. Most of the major process steps may be automated. Excessive temperatures are not required (for eutectic solder), nor are chemical tanks or vacuum. The process allows inspection and rework at two points: paste touch-up after paste deposition, and bump touch-up/replacement after mask removal (FIG. 4–418, 420, 426, 428).

FIG. 3, F through H, illustrate the assembly of two substrates by means of flip chip assembly process. The bumped substrate 342 is flipped and the bumps 338 placed in contact with the receiving substrate 350. Reflow 352 and enderfill 354 steps familiar to those practiced in flip chip assembly result in a completed substrate-substrate interconnection (FIG. 3H).

The method taught herein provides for high volume production, on the order of 80–100,000 bumps per hour on the basis of 20,000 bumps per 15 minutes.

Harsh electroplating chemicals are not required and the problem of disposing of contaminated baths is eliminated. Because the Pb metal alloy is in paste form, it is well-contained, thereby posing fewer hazards with handling and less of a waste problem.

Additional Process Options

After metal bumps have been formed on a substrate, certain processes may require that metals of a different composition coat the metal bump. The process for CPD described above can be used to coat the metal bumps.

Figure 6A:
Figure 6B:
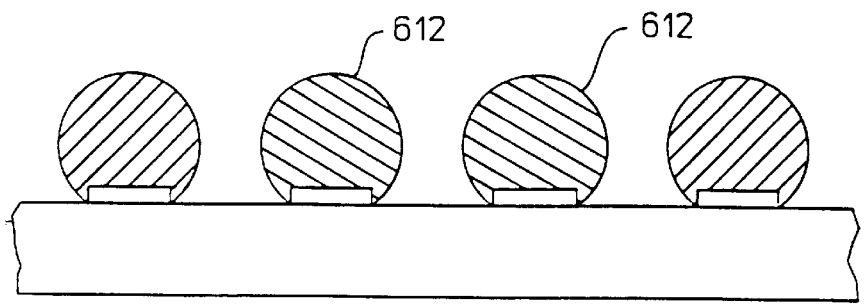
Figure 6C:
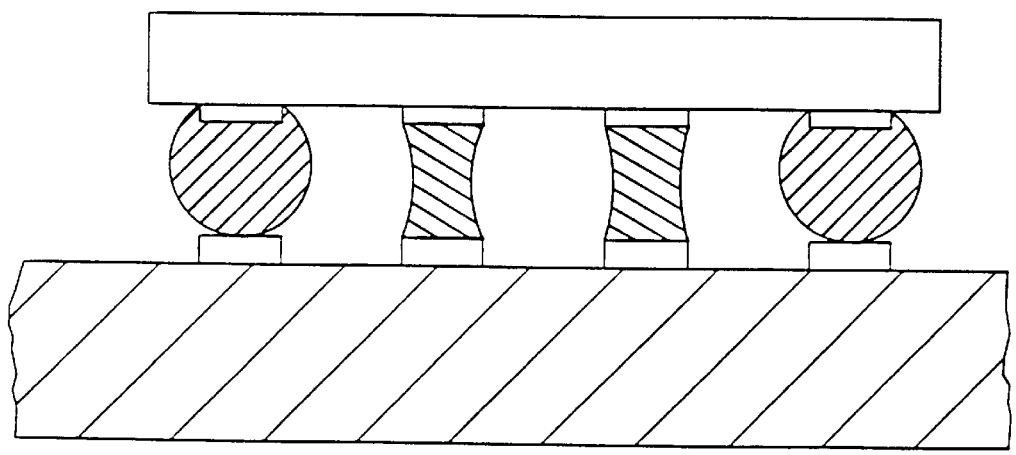

Some applications require that a stand-off be provided to set and control the height between two substrates. See FIG. 6A. With CPD, both the stand-off bump 610 and the metal bumps for interconnection 612 can be formed on the substrate. Normally, the stand-off is a material that does not melt at the desired processing temperature. Thus, the standoff must be formed first on the substrate. This is accomplished by using the CPD process and depositing the stand-off material at the appropriate locations on the substrate as shown in FIG. 6.

At the completion of the first sequence, the substrate contains the metal stand-off bumps at the appropriate locations. The substrate is then processed through the contained paste deposition a second time to form the lower temperature bumps at the interconnect locations as shown in FIG. 6B.

During the interconnect bump process, the lower temperature metal paste is deposited at all the appropriate locations. At the stand-off locations, there are two options.

Option 1

The substrate side of the stencil is partially etched to provide clearance for the stand-off metal without depositing the lower temperature metal paste.

Option 2

The lower temperature metals paste is deposited on top the stand-off bump and will form a coating over the stand-off.

Ball production

Another embodiment of the inventive process is the generation of unattached metal balls rather than metal bumps.

Figure 3E:
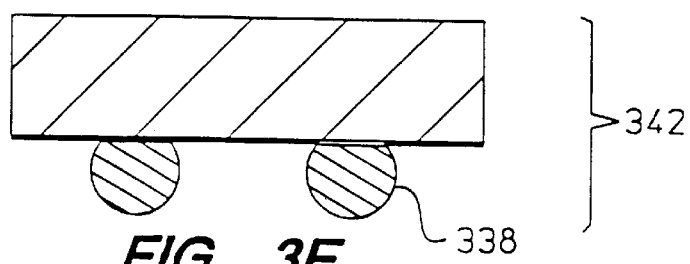
Figure 3F:
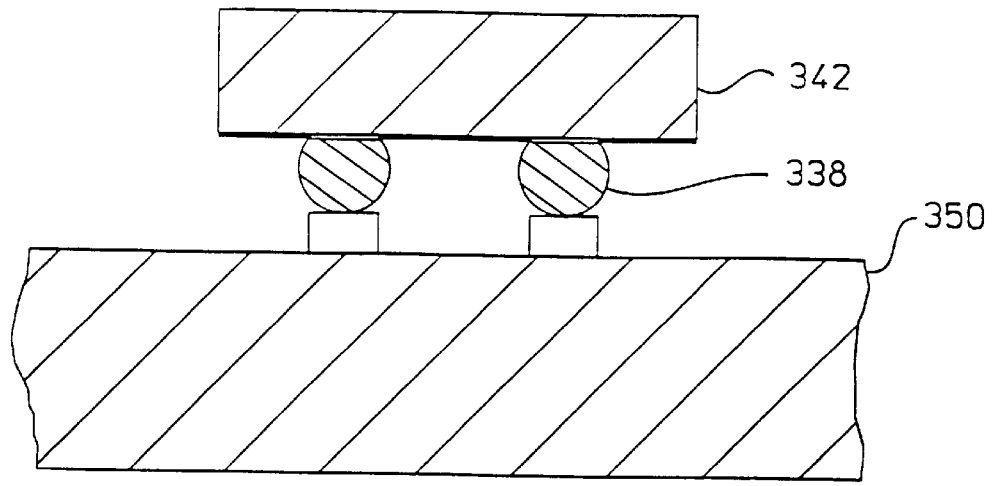
Figure 3G:
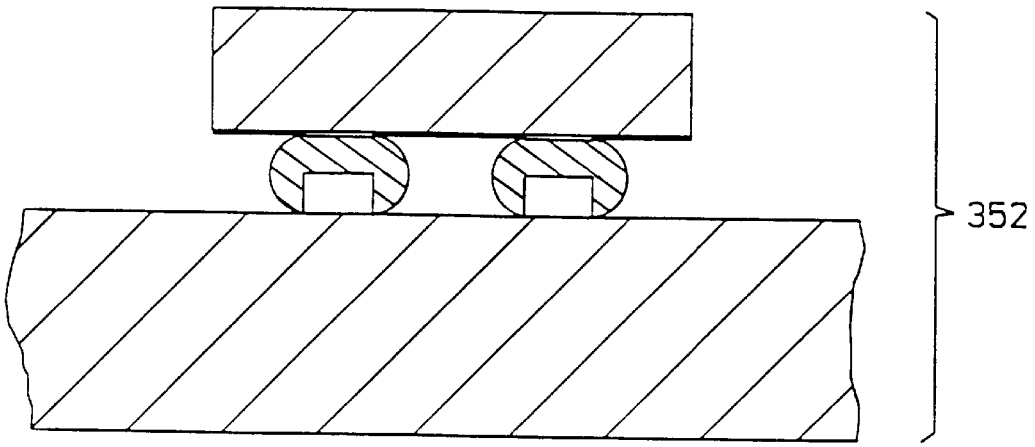
Figure 3H:
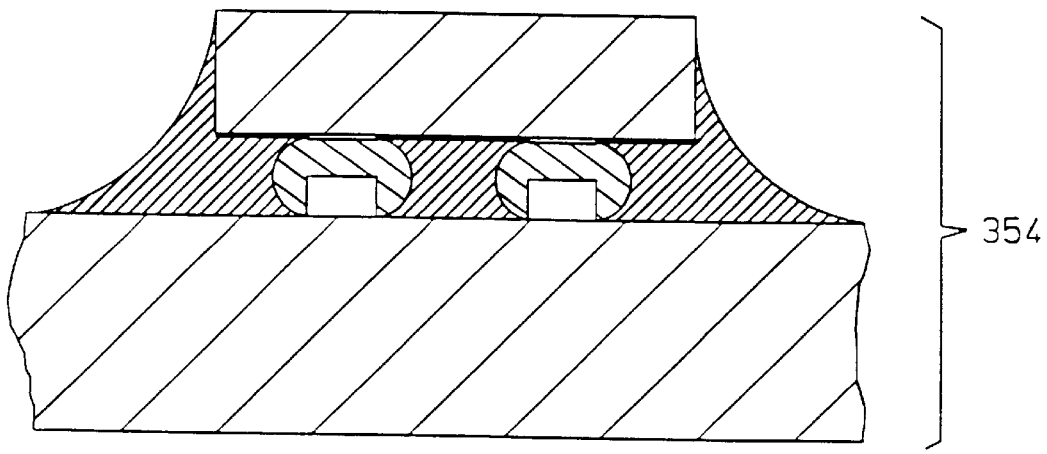
Figure 7:
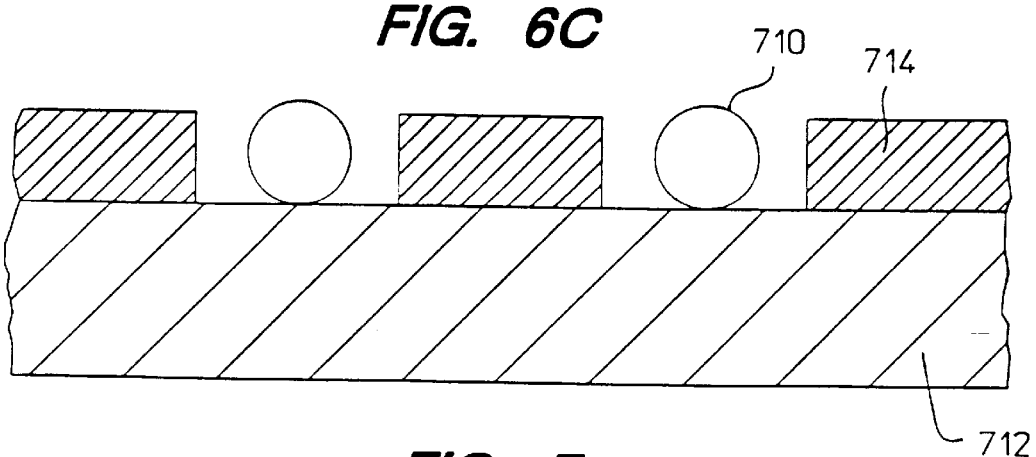
FIG. 7 represents CPD providing controlled-volume ball production.

As depicted in FIG. 7, the product of CPD steps are spheres or balls 710 similar to those in FIG. 3E, with several important differences. In CPD for ball formation, the first step, material selection, is the same with respect to paste. However the substrate 712 may have no wettable surfaces and the mask 714 may be configured with apertures so as to maximize the number of balls 710 produced. Since the substrate has no wettable surfaces, the alignment step is unnecessary and may be eliminated. Paste deposition, and reflow are the same. The mask may be removed if it is metal or an embodiment may be used in which the mask need not be removed for ball collection and cleaning of the mask-substrate assembly prior to re-use. For any embodiment, the balls 710 are collected and both the substrate and mask cleaned for re-use.

The photoimageable mask method may also be used for making balls, so long as the subtrate is not wettable. It may be desirable that the mask in this method be removed from the substrate after multiple uses of the substrate-mask assembly. The assembly may be re-used without removing the mask so long as proper cleaning is scrupulously observed. The substrate may be re-used independent of whether or not the mask is reused.

Balls produced by CPD may be used on an individual basis to touch up substrates bumped by CPD. CPD-produced balls may also be used in OMPAC, BGA or other bumping or packaging methods. CPD replaces methods of ball production such as blowing molten metal into oil. As taught herein, CPD produces a well-controlled method of producing precisely the volume ball desired in the quantity required.

We claim:

1. A method of forming solder bumps on a substrate having a plurality of bonding pads, comprising:

selecting a mask of a solder non-wettable material, the mask having first and second planar sides;

forming a plurality of apertures between the sides at locations in the mask selected to align with the bonding pads when the mask is placed in proximity to the substrate, to thereby form a prefabricated mask;

placing the prefabricated mask in registration with the substrate, such that the first planar side of the mask lies against the substrate, and aligning the mask with the substrate such that the apertures overlie the bonding pads;

loading the apertures with solder metal and solder flux through the second planar side of the mask, such that solder metal and solder flux contact the bonding pads and substantially fill the apertures; and heating the substrate, solder metal and solder flux, such that the solder metal within the apertures coalesces into solder bumps, and thereafter cooling the substrate and solder bumps such that the solder bumps form and are affixed to the bonding pads.

2. A method according to claim 1, further comprising pre-mixing the solder metal and solder flux to include a powder of tin and bismuth, and mixing the powder with a flux material to form a mixture such that when heated, the mixture coalesces to form a solder having a substantially uniform composition.

3. A method according to claim 1, wherein selecting a mask includes selecting a non-metal mask.

4. A method according to claim 1, wherein selecting a mask includes selecting a silicon-based mask.

5. A method according to claim 1, wherein selecting a mask includes selecting a mask having apertures defined to form solder balls having a pitch of less than three-hundred and fifty microns.

6. A method according to claim 1, wherein:
heating the substrate, solder metal and solder flux includes heating the substrate, mask, solder metal and solder flux with the mask still in registration with the substrate; and
said method further comprises removing the mask from the substrate subsequent to heating, leaving the solder bumps adhered to the bonding pads for subsequent electrical assembly of the substrate to another device using the solder bumps.

7. A method according to claim 1, wherein said method further comprises:
heating the substrate, solder metal and solder flux includes heating the substrate, mask, solder metal and solder flux with the mask still in registration with the substrate; and
said method further comprises removing the mask from the substrate, such that subsequent to heating, the solder bumps remain adhered to the bonding pads for subsequent electrical assembly of the substrate to another device using the solder bumps.

8. A method according to claim 1, wherein said method further comprises:
subsequent to the cooling of the substrate and solder bumps, attaching a second substrate atop the solder bumps, such that the solder bumps connect two substrates, to thereby provide an electrical interconnection between the two substrates.

9. A method according to claim 8, wherein said method further comprises:
subsequent to the cooling of the substrate and solder bumps, depositing an underfill around the solder bumps, in association with electrical interconnection between the two substrates.

10. A method according to claim 1, wherein selecting a mask includes selecting a polymer mask.

11. A method according to claim 1, further comprising pre-mixing the solder metal and solder flux to such that solder bumps are formed with greater than forty percent lead by weight.

12. A method according to claim 1, wherein said method further comprises:
subsequent to the cooling of the substrate and solder bumps, attaching a chip atop the solder bumps, such that the solder bumps connect the chip and the substrate, to thereby provide a flip chip electrical interconnection between the chip and substrate.

13. A method according to claim 1, wherein selecting the mask includes selecting a film material that is adhered to the substrate.

14. A method of forming solder bumps on a substrate having a plurality of bonding pads, using a mask formed of a solder non-wettable material, comprising:
forming a plurality of apertures in the mask at locations in the mask selected to align with the bonding pads when the mask is placed in proximity to the substrate, to thereby form a prefabricated mask, and loading the openings with solder metal and solder flux such that the solder metal and solder flux substantially fill the apertures;
with the prefabricated mask in registration with the substrate, aligned such that the apertures overlie the bonding pads, heating the substrate and mask such that solder bumps are adhered to the bonding pads, and thereafter cooling the solder bumps; and
removing the mask from the substrate.

15. A method according to claim 14, wherein selecting a mask includes selecting a non-metal mask.

16. A method according to claim 14, wherein selecting a mask includes selecting a silicon-based mask.

17. A method according to claim 14, wherein selecting a mask includes selecting a polymer mask.

18. A method according to claim 14, wherein heating the substrate and mask includes heating the substrate, mask, and solder metal and solder flux, such that solder balls coalesce with the mask and the substrate in registration, on the bonding pads.

* * * * *